(12) United States Patent
Seidler

(10) Patent No.: US 6,796,485 B2
(45) Date of Patent: Sep. 28, 2004

(54) SOLDER-BEARING ELECTROMAGNETIC SHIELD

(75) Inventor: Jack Seidler, Flushing, NY (US)

(73) Assignee: Nas Interplex Inc., Flushing, NY (US)

( * ) Notice: Subject to any disclaimer, the term of this patent is extended or adjusted under 35 U.S.C. 154(b) by 0 days.

(21) Appl. No.: 10/341,191

(22) Filed: Jan. 13, 2003

(65) Prior Publication Data

US 2003/0136812 A1 Jul. 24, 2003

Related U.S. Application Data

(60) Provisional application No. 60/351,661, filed on Jan. 24, 2002.

(51) Int. Cl.[7] ................. B23K 35/12; B23K 31/02; H01J 1/52; H01J 5/02; H01J 37/00
(52) U.S. Cl. ............... 228/255; 228/180.1; 228/249; 315/85
(58) Field of Search ................ 228/179.1, 180.1, 228/245, 246, 249, 255; 174/35 R, 35 C; 315/85

(56) References Cited

U.S. PATENT DOCUMENTS

| 3,678,445 A | * | 7/1972 | Brancaleone | ............... 439/609 |
| 4,365,736 A | | 12/1982 | Stumm | ............... 228/121 |
| 4,890,199 A | | 12/1989 | Beutler | ............... 361/424 |
| 4,912,604 A | * | 3/1990 | Vaisanen | ............... 361/818 |
| 5,037,332 A | | 8/1991 | Wilson | ............... 439/608 |
| 5,129,573 A | | 7/1992 | Duffey | ............... 228/180.1 |
| 5,235,131 A | * | 8/1993 | Mueller et al. | ............ 174/35 R |
| 5,352,925 A | | 10/1994 | Sudoh et al. | ............... 257/659 |
| 5,418,688 A | | 5/1995 | Hertz et al. | ............... 361/790 |
| 5,608,188 A | | 3/1997 | Choon et al. | ............ 174/35 R |
| 5,621,363 A | | 4/1997 | Ogden et al. | ............... 333/12 |
| 6,092,714 A | | 7/2000 | Casey | ............... 228/205 |
| 6,442,832 B1 | | 9/2002 | Noble | ............... 29/854 |
| 6,490,173 B2 | * | 12/2002 | Perkins et al. | ............... 361/816 |
| 6,649,827 B2 | * | 11/2003 | West et al. | ............ 174/35 R |
| 2001/0053070 A1 | * | 12/2001 | Kitamura et al. | ............ 361/818 |
| 2002/0075664 A1 | * | 6/2002 | Perkins et al. | ............... 361/816 |
| 2003/0062178 A1 | * | 4/2003 | West et al. | ............ 174/35 R |

* cited by examiner

Primary Examiner—Stanley C. Silverman
Assistant Examiner—Colleen P. Cooke
(74) Attorney, Agent, or Firm—Darby & Darby

(57) ABSTRACT

An electromagnetic shield is provided and includes a shield body having an upper wall connected to opposing side walls and opposing end walls. At least two opposing walls of the electromagnetic shield each have a plurality of resilient fingers formed at a lower edge thereof. The electromagnetic shield also includes a solder mass securely held by the fingers by being interleaved between the fingers of each of the at least two opposing walls. The interleaving of the solder mass results in the solder mass being securely held by the fingers and ready for mounting to an electronic component for shielding a portion of the electronic component from undesirable and potentially damaging emissions from neighboring components. A method of mounting an electromagnetic shield to an electronic component having a planar surface and a method of interleaving the solder mass are also provided.

15 Claims, 4 Drawing Sheets

SOLDER-BEARING ELECTROMAGNETIC SHIELD

CROSS-REFERENCE TO RELATED APPLICATIONS

This application claims the benefit of U.S. patent application Ser. No. 60/351,661, filed Jan. 24, 2002 which is hereby incorporated by reference in its entirety.

TECHNICAL FIELD

The present invention relates generally to shields used in the protection of electronic components from electromagnetic and radio frequency interference and more specifically, relates to radio frequency (RF) shields mounted on printed circuit boards and the like.

BACKGROUND OF THE INVENTION

Electronic components, such as resistors, capacitors, and semiconductor components, are often subjected to undesirable emissions, such as electromagnetic and radio frequency interference, from neighboring components that emit such interference. The emitted interference adversely impacts the performance and integrity of the electronic components as these emissions interfere with the operation of the electronic components by temporarily altering or distorting their essential characteristics, which thus leads to adverse performance.

Several methods are available for protecting and shielding one or more electronic components from the electromagnetic and radio frequency interference which is occurring in the proximate vicinity of the electronic component, e.g., a printed circuit board (PCB). One method of protecting an electronic component from such emissions is to provide a shield which serves to shield an area of the printed circuit board(s), or a volume associated therewith. The shield functions by either containing electromagnetic energy, e.g., radiated RF signals, within a shielded volume or area or the electromagnetic energy is excluded by the shield structure from the shielded volume or area.

Such shielding is extensively used in television receivers, direct satellite broadcast receivers, radio receivers such as FM and shortwave, or portions of audio systems, wherein low signal level circuitry is amenable to being effected by stray electromagnetic fields emanating from AC power sources.

A printed circuit board (PCB) is a common electronic component to which a shield can be applied since PCBs enjoy widespread use in a number of electronic applications. The term "printed circuit board" generally refers to circuit boards having electrical conductors disposed on one or more side of a substrate (e.g., a dielectric substrate). Often a PCB will have openings or the like formed through the substrate to receive electrical leads of an electronic component that is mounted on one side of the PCB. The electrical leads extend through the openings to contact pads disposed on the other side of the PCB. The leads are typically soldered to the contact pads.

There are several techniques for mounting the shield to the PCB. One technique is to directly solder the shield to a ground plane of a PCB that is proximate to electromagnetic and radio frequency emitting components. Another technique involves the use of shield clips coupled to the ground plane of a PCB to which a shield is permanently attached. Another technique involves the use of removable shields attached to shield clips coupled to the ground plane of the PCB.

There are several disadvantages associated with the above-recited techniques. One disadvantage is that it is often time consuming to solder the shield to the ground plane of the PCB. This results in increased manufacturing cost. Another disadvantage is that it can be cumbersome to apply the solder to the shield and then join the shield to the ground plane.

Accordingly, it is desirable to provide a solderable shield that can easily and effectively be soldered to a portion of an electronic component, such as a PCB.

SUMMARY OF THE INVENTION

An electromagnetic shield is provided and includes a shield body having an outer wall. The outer wall has a plurality of resilient fingers formed at a lower edge thereof. The electromagnetic shield also includes a solder mass securely held by the fingers by being interleaved between the fingers. The interleaving of the solder mass results in the solder mass being securely held by the fingers and ready for mounting to an electronic component for shielding a portion of the electronic component from undesirable and potentially damaging emissions from neighboring components.

A method of mounting an electromagnetic shield to an electronic component having a planar surface is also provided. The electromagnetic shield has a shield body that it typically open on one face thereof and which defines an interior space. The method includes the steps of (a) forming a plurality of fingers in the electromagnetic shield, wherein the fingers are formed at a lower edge of electromagnetic shield and each finger is defined by a pair of slots formed in the electromagnetic shield on each side of the finger; (b) interleaving a solder mass between the fingers such that the solder mass is securely held by the fingers; (c) disposing the electromagnetic shield on the planar surface of the electronic component so that a predetermined section of the electronic component is disposed within or underneath the interior space of the shield; (d) reflowing the solder mass; and (e) cooling the reflowed solder mass so as to provide a secure solder connection between the shield and the electronic component.

According to one embodiment, the step of interleaving the solder mass includes the steps of (a) bending a first set of the plurality of fingers in a first direction; (b) bending a second set of the plurality of fingers in a second direction, thereby forming a channel between the bent first and second set of fingers; (c) disposing the solder mass within the channel; and (d) bending the first set of fingers in the opposite second direction and bending the second set of fingers in the opposite first direction so as to cause the solder mass to become interleaved between the first and second set of fingers.

The interleaving of the solder mass at a lower edge of the electromagnetic shield provides an effective yet easy manner of securely retaining the solder mass before and during a mounting operation where the electromagnetic shield is securely mounted on an electronic component, such as a printed circuit board (PCB) so as to shield certain sensitive areas of the electronic component from emissions generated by neighboring components.

Other features and advantages of the present invention will be apparent from the following detailed description when read in conjunction with the accompanying drawings.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1:
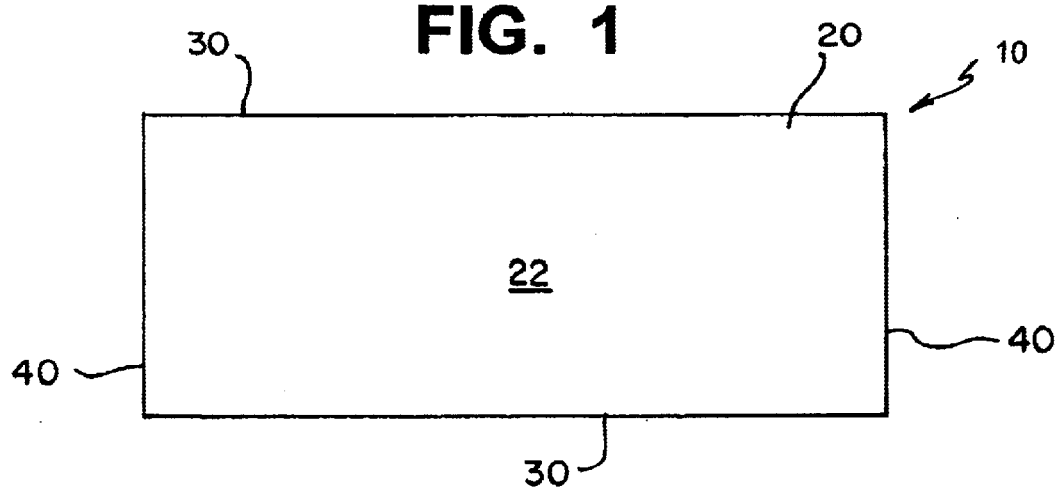
FIG. 1 is a top plan view of an electromagnetic shield according to a first exemplary embodiment prior to bending of resilient fingers formed as a part thereof.

Referring to FIGS. 1 through 8, an electromagnetic shield according to a first exemplary embodiment is generally indicated at 10. The electromagnetic shield 10 has an upper wall 20 that defines an upper surface 22 and includes opposing side walls 30 and opposing end walls 40. When the electromagnetic shield 10 is mounted to a component side of an electronic component, such as a printed circuit board (PCB)(not shown), the upper surface 22 of the upper wall 20 faces away from the electronic component. Preferably, the electromagnetic shield 10 is preferably formed as a unitary member and therefore, the opposing side walls 30 and opposing end walls 40 are preferably integrally formed with the upper wall 20.

Figure 2:
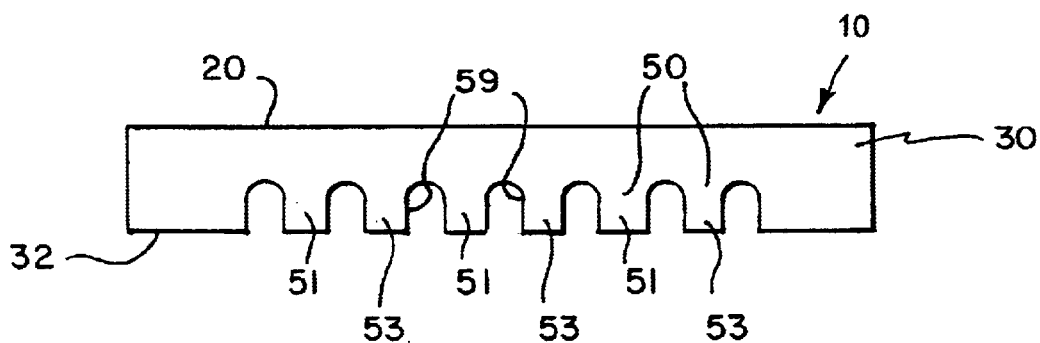
FIG. 2 is a side elevational view of the shield of FIG. 1.

As illustrated in the embodiment of FIG. 1, the electromagnetic shield has a plurality of fingers 50 that are formed along a respective side wall 30. According to one exemplary embodiment, the fingers 50 are provided on each of the opposing side walls 30. The fingers 50 are formed by creating a series of slots 59 in the side wall 30 along a length thereof. The slots 59 are formed at a lower edge 32 of the side wall 30 and are defined by an open first end at the lower edge 32 and a closed second end. In the illustrated embodiment, the closed second end of the slot 59 is rounded; however, it will be understood that the slot 59 can be formed to have any number of shapes, i.e., a rectangular shape by having a planar second slot end. Between a pair of slots 59, one finger 50 is formed. The lower edge 32 of the side wall 30 also defines a distal end of the finger 50. As best shown in FIG. 2, each finger 50 has a generally rectangular shape; however, once again, the shape of the finger 50 is not critical and the fingers 50 can have any number of different shapes.

As shown in FIGS. 1 and 2, each side wall 30 connects at an upper end thereof to the upper wall 20 with the side wall 30 preferably being substantially perpendicular to the upper wall 20. The lower edge 32 of the side wall 30 is preferably contained within the same plane as a lower edge 42 of each of the end walls 40. The lower edges 32, 42 are ground contacting surfaces as these edges 32, 42 contact and seat against the electronic component (not shown) when the electromagnetic shield 10 is mounted to the electronic component.

The lower edge 32 is not a continuous, linear edge that extends between the end walls 40 as the fingers 50 are formed at the lower edge 32, as previously-mentioned. In this embodiment, the lower edge 42 is a liner edge.

The electromagnetic shield 10 is formed of a suitable material that has properties that permit the electromagnetic shield 10 to function as an electromagnetic shield that prevents electromagnetic energy, e.g., radiated RF signals, from entering the shielded volume or area that is defined underneath the electromagnetic shield 10 and between the electromagnetic shield 10 and the component side of the electronic component. The electromagnetic shield 10 is also formed of a material that permits the fingers 50 to be of a resilient nature as the fingers 50 are bent during use of the electromagnetic shield 10.

Figure 3:
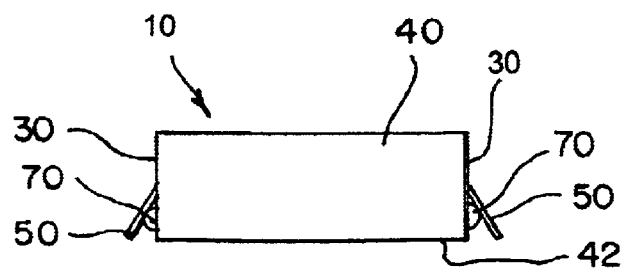
FIG. 3 is an end elevational view of the shield of FIG. 1 with solder masses being held by fingers formed as part of each side wall of the shield.

The number of fingers 50 formed on each side wall 30 varies according to a number of factors, including the dimensions of the electromagnetic shield 10 and the desired number of solder connection points. More specifically, the provision of more fingers 50 on each side wall 30 provides more solder connection points between the electromagnetic shield 10 and the electronic component (not shown). As shown in FIG. 3, according to this first embodiment, the end walls 40 do not contain fingers 50. The end wall 40 contains the linear lower edge 42.

The construction and function of the fingers 50 is now described. In the illustrated embodiment, the fingers 50 are defined in each side wall 30 and are spaced apart from one another by the slots 59. Because the fingers 50 are formed of a resilient material, the fingers 50 are capable of being bent in a direction either toward an interior of the shield 10 or in an opposite direction outwardly away from the upper wall 20 of the side wall 30. The fingers 50 are configured so as to receive and retain a solder mass 70 along the lower edge 32 of the side wall 30.

The solder mass 70 preferably comprises a solder wire having a sufficient length to extend a length of the side wall 30 and be captured and retained by the fingers 50. One technique for retaining the solder mass 70 is to first bend a first set 51 of fingers 50 in a first direction, while also bending a second set 53 of fingers 50 in an opposite second direction. The first set 51 of fingers is defined as including fingers that alternate with fingers of the second set 53. Thus, every other finger is bent in one direction (i.e., the first direction), while the other fingers are bent in the other direction (i.e., the second direction).

Figure 4:
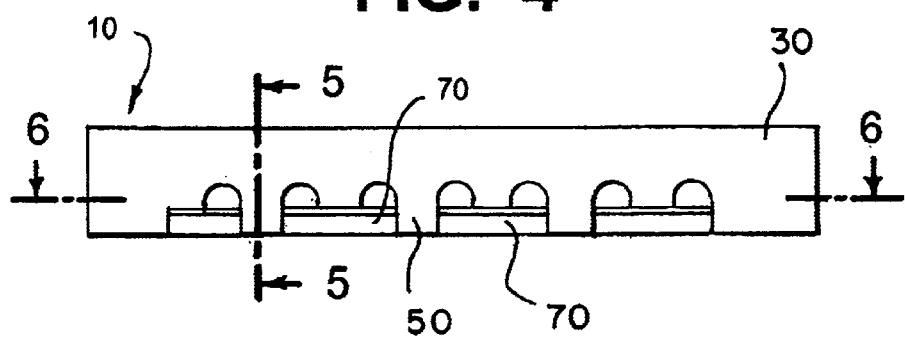
FIG. 4 is a side elevational view of a solder mass being interleaved between fingers formed as part of the side wall.

For purposes of illustration only, six fingers 50 are formed in the embodiment shown in FIG. 4 with the first finger at the left side belonging to the first set 51 of fingers and the last finger at the right side belonging to the second set 53 of fingers. When there is an even number of fingers 50, the first and last finger will not belong to the same set. When there is an odd number of fingers, the first and last fingers belong to the same set.

Figure 5:
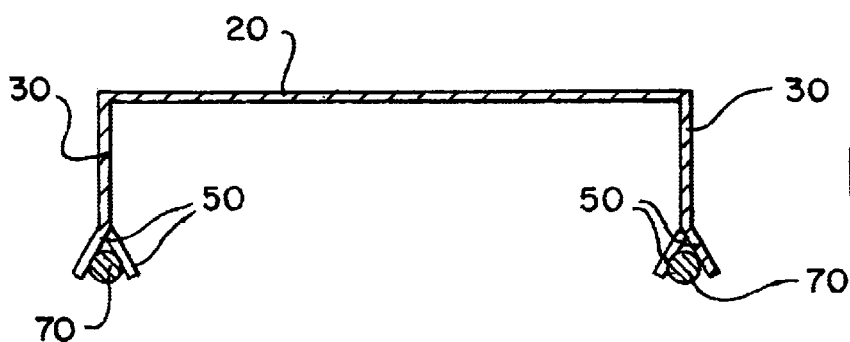
FIG. 5 is a cross-sectional view taken along the line 5—5 of FIG. 4.
Figure 6:
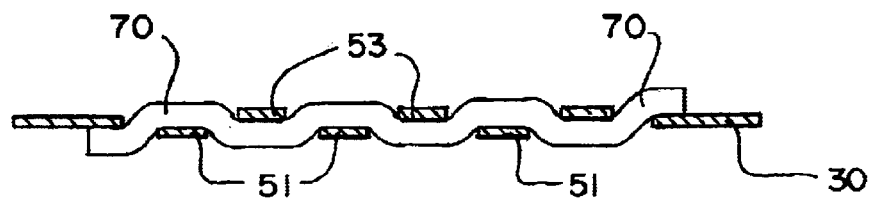
FIG. 6 is a cross-sectional view taken along the line 6—6 of FIG. 4.
Figure 7:
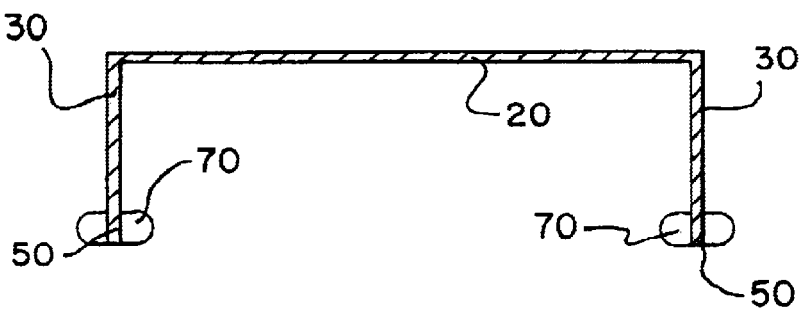
FIG. 7 is a cross-sectional view of the shield of FIG. 5 after the fingers have been closed, thereby causing the solder mass to become interleaved between the fingers.

As shown in FIGS. 4 through 6, once the first set 51 of fingers is bent in the first direction and the second set 53 of fingers is bent in the opposite second direction, a channel is formed along the lower edge 32 of the side wall 30 between the oppositely bent fingers 50. As best shown in FIG. 5, the channel is generally V-shaped due to the fingers 50 being bent outwardly from the plane containing the other sections of the side wall 30. Once the fingers 50 have been bent, the solder mass 70 is disposed within the channel between the fingers 50. The fingers 50 are then bent toward one another so as to engage and securely retain the solder mass 70 therebetween, as shown in FIG. 7. Preferably, the fingers 50 are bent back close to their original position without jeopardizing the integrity of the solder mass 70, while at the same time, this action causes the solder mass 70 to become interleaved between the fingers 50. In other words, the fingers 50 are not bent significantly out of the plane containing the side wall 30 when the fingers 50 are bent back after the solder mass 70 has been introduced and interleaved between the fingers 50. It is preferred that the fingers 50 be generally coplanar with the respective side wall 30 so as to reduce the amount of space that the shield 10 occupies. Thus, FIG. 7 shows the fingers 50 being generally restored to their original positions prior to the bending of the fingers 50 and insertion of the solder mass 70.

Figure 8:
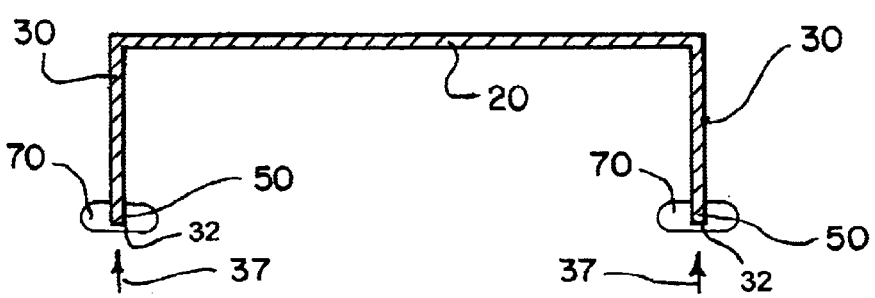
FIG. 8 is a cross-sectional view of the shield of FIG. 7 after a coining operation has been performed to compress the solder mass.

When the solder mass 70 is interleaved, the solder mass 70 can extend slightly below the lower edge 32 of the fingers 50. Optionally and as shown in FIG. 8, the interleaved solder mass 70 is coined using a conventional coining operation when the solder mass 70 extends slightly below the lower edge 32. In a conventional coining operation, a force is applied in the direction indicated by arrows 37 against the solder mass 70 so as to compress the solder mass 70, thereby causing the solder mass 70 to become more co-incident with the lower edge 32. In other words, the coplanarity between the lower edge 32 and the solder mass 70 increases. The coining operation thus reduces the degree that the solder mass 70 extends below the fingers 50. This creates a better solder joint as the lower edge 32 of the fingers 50 are the surfaces that will contact and be connected to another surface.

As best shown in FIGS. 4 and 6, the solder mass 70 is effectively retained by being interleaved between the first set 51 of fingers and the second set 53 of fingers. The size of the slots 59 is not critical and can actually be less than the size of the solder mass 70 as the solder mass 70 is very malleable and will not shear apart when the fingers 50 are closed. Friction between the slots 59 and the fingers 50 acts to hold the solder mass 70 in place. Preferably, the solder mass 70 is held in a position such that the solder mass 70 extends flush against or slightly below the bottom edge of the fingers 50.

Figure 9:
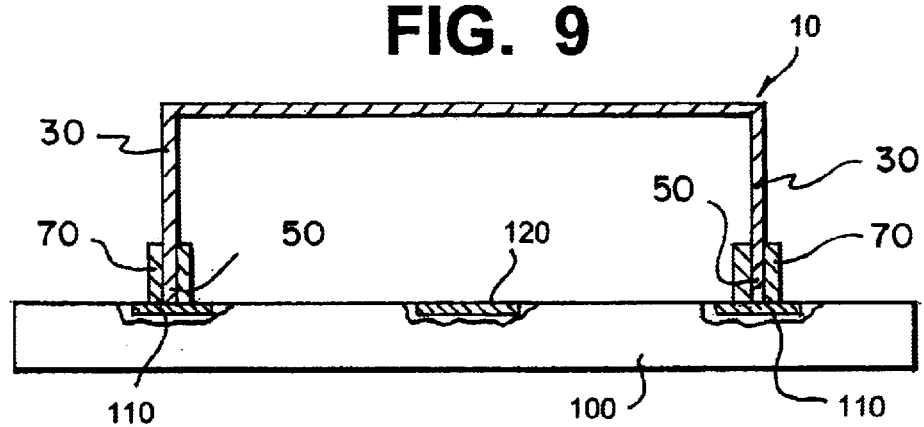
FIG. 9 is a cross-sectional view of the shield of FIG. 8 being positioned relative to an electronic component, such as a printed circuit board.

After the solder mass 70 is securely retained by the fingers 50 (and the solder is coined if this operation is optionally performed), the electromagnetic shield 10 is placed on an electronic component, such as the printed circuit board (PCB) 100, shown in FIG. 9. FIG. 9 shows a cross-sectional view of the electromagnectic shield 10 placed on top of the printed circuit board 100. The printed circuit board 100 contains a number of pads 110 that are formed of a solderable material. The printed circuit board 100 also contains certain sensitive elements 120, i.e., circuitry components, which are to be shielded from undesirable emissions. The electromagnetic shield 10 is therefore arranged on the printed circuit board 100 such that the solder mass 70 is generally disposed over the pads 110, as shown in FIG. 9. The solder mass 70 is then reflowed using conventional techniques, such as applying heat to the solder mass. The heat can be delivered in any number of forms, including hot air that is directed onto the solder mass 70 or the entire assembly can be subjected to an elevated temperature, causing the solder reflow, so long as the printed circuit board 100 is not damaged.

Figure 10:
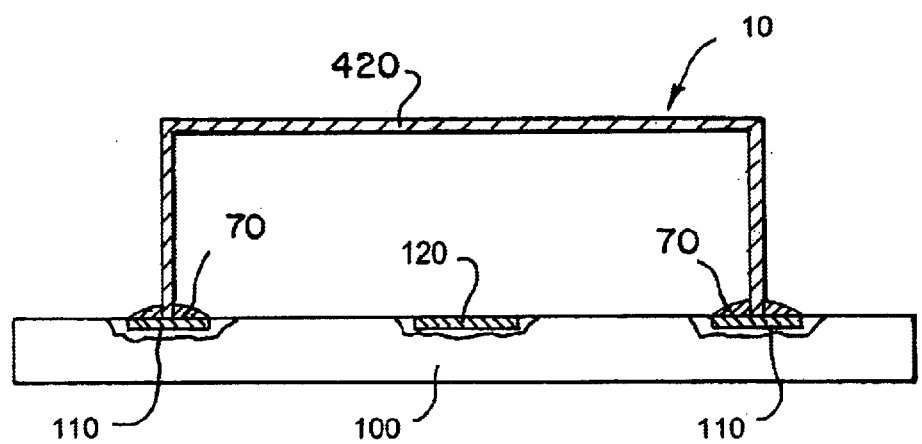
FIG. 10 is an cross-sectional view of the shield of FIG. 8 being securely mounted to the electronic component after a solder reflow operation has been performed.

FIG. 10 shows the solder mass 70 after it has been reflowed, thereby producing a secure solder connection between the electromagnetic shield 10 and the printed circuit board 100. With the electromagnetic shield 10 secured in place, the shield 10 covers the sensitive elements 110 formed on the printed circuit board 100 from any neighboring emitting components.

If removal of the electromagnetic shield 10 is necessary, the solder connection between the electromagnetic shield 10 and the printed circuit board 100 can be broken by heating the solder mass 70 to cause the solder mass 70 to reflow. The electromagnetic shield 10 is then removed and access is provided to the sensitive elements 110. If the electromagnetic shield 10 is to be reapplied, a new solder mass 70 (i.e., solder wire) is simply interleaved between the fingers 50 using the technique disclosed hereinbefore. After closing the fingers 50 so that the solder mass 70 is securely retained, the electromagnetic shield 10 is properly positioned relative to the printed circuit board 100 and the solder mass 70 is reflowed to provide the solder connection between the electromagnetic shield 10 and the printed circuit board 100.

Figure 11:
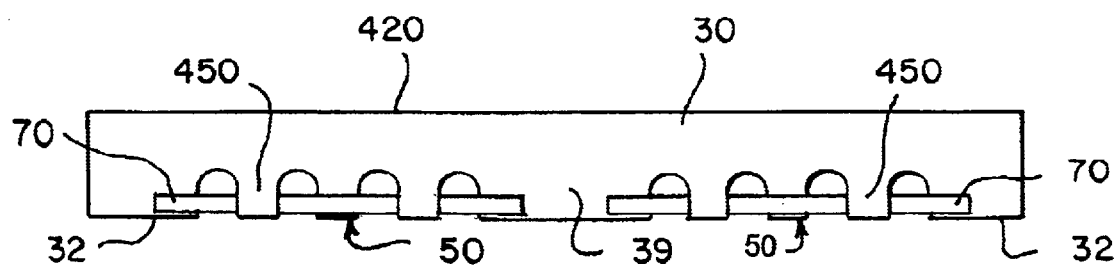
FIG. 11 is side elevational view of a side wall of an electromagnetic shield, wherein a first solder mass is interleaved between a first set of fingers and a second solder mass is interleaved between a second set of fingers.

It will be understood that the solder mass 70 does not have to be in the form of a continuous length of solder wire; but rather, can be in the form of two or more separate smaller solder wire segments 70, as shown in FIG. 11. In this embodiment, the side wall 30 can have a solid section 39 between two sets of fingers 50. In this embodiment, the location of each set of fingers 50 corresponds to one or more pads of the printed circuit board such that when the shield is disposed on the printed circuit board, one finger set is disposed over one or more pads and the other finger set is disposed over one or more other pads.

It will further be appreciated that while the electromagnetic shield 10 of the exemplary embodiment illustrated in FIGS. 1 through 11 has a rectangular shape, it will be understood that the electromagnetic shield 10 is not limited to having a rectangular shape; but rather, the electromagnetic shield 10 can have any number of other shapes, including a square, an oval, etc. The dimensions and volume of the interior space of the electromagnetic shield 10 should be sufficient to cover and shield the sensitive elements 120 when the electromagnetic shield 10 is mounted to the electronic component 100.

Figure 12:
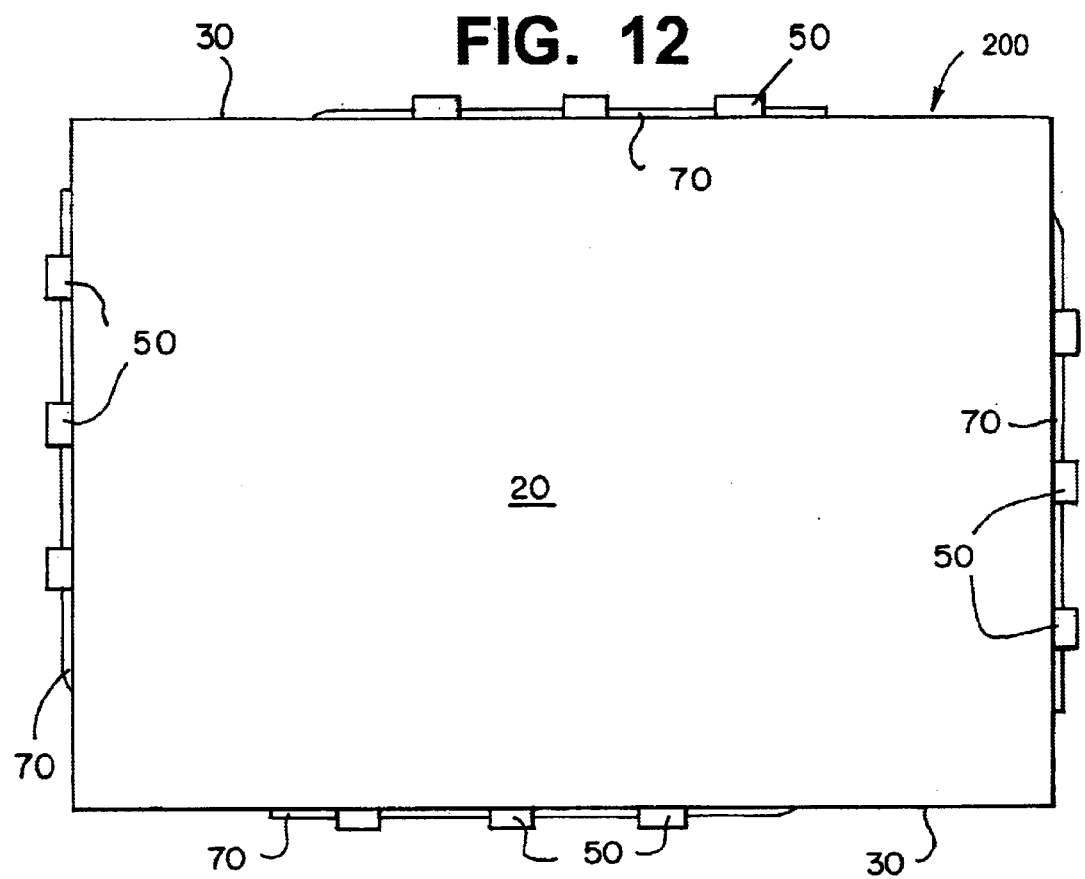
FIG. 12 is a top plan view of an electromagnetic shield according to a second embodiment.
Figure 13:
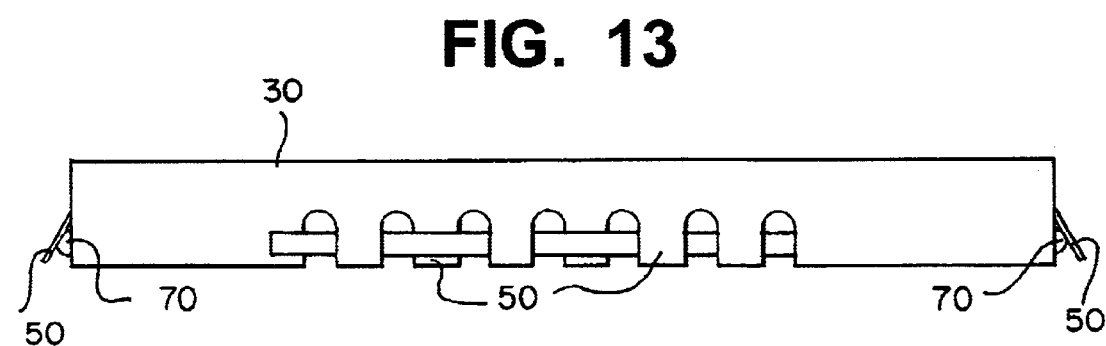
FIG. 13 is a side-elevational view of the electromagnetic shield of FIG. 12.
Figure 14:
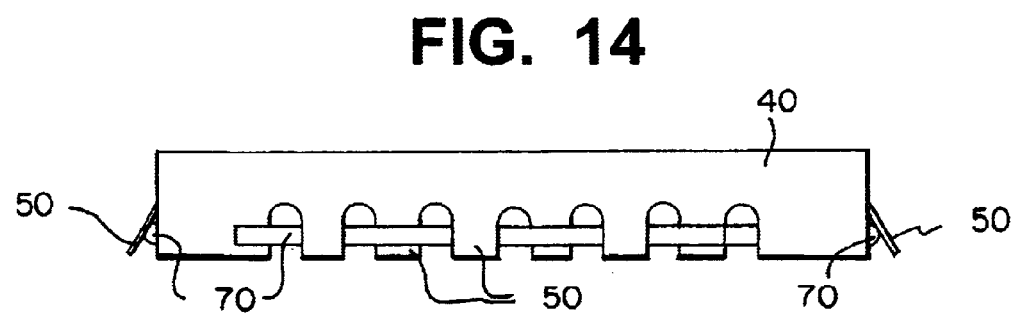
FIG. 14 is an end-elevational view of the electromagnetic shield of FIG. 12.

Now referring to FIGS. 12–14, which illustrate an electromagnetic shield 200 according to a second exemplary embodiment. The electromagnetic shield 200 is very similar to the electromagnetic shield 10 and therefore like elements have been numbered alike and only the differences between the two embodiments will be described in detail.

The electromagnetic shield 200 has a plurality of fingers 50 with the difference being that the end walls 40 are formed to also include a number of fingers 50. In this embodiment, a solder connection is formed between each wall 30, 40 that seats against the electronic component, while in the embodiment of FIGS. 1–10, a solder connection is only provided between the side walls 30 and the electronic component. By increasing the number of solder connections, the robustness and integrity of the solder connection are increased. FIG. 12 is a top plan view illustrating solder masses 70 being retained by fingers 50 that are formed on each of the side walls 30 and each of the end walls 40.

The solder masses 70 are retained by the fingers 50 in the same manner as described previously with reference to the embodiment of FIGS. 1–10. In other words, each solder mass 70 is interleaved between the fingers 50. FIG. 13 shows one side wall 30 with one interleaved solder wire 70, while FIG. 14 shows one end wall 40 with one interleaved solder wire 70. This type of electromagnetic shield 200 is to be used with an electronic component that has a similar pattern of solderable pads arranged on the electronic component.

It will be understood that one or more of the side and end walls 30, 40 of the electromagnetic shield 200 can have the structure shown in FIG. 11, where the fingers 50 are divided into two or more discrete sets with a spacer section formed therebetween. Further, the number of fingers 50 formed as part of each side wall 30 does have to equal the number of fingers 50 formed as part of each end wall 40. One will also appreciate that the number of fingers 50 on one side wall 30 can differ from the number of fingers 50 of the other side wall 30 and the same is true relative to the end walls 40. For manufacturing ease, the opposing walls of the shield are preferably symmetrical. The electromagnetic shields of the exemplary embodiments disclosed herein are typically manufactured using a metal stamping method, as is well known, employing, for example, high speed punch presses and progressive dies. When conventional stamping techniques are used, a blank is first provided and the features of the electromagnetic shield 10 are then formed during the stamping process. By using a stamping process, the number, size and shapes of the fingers 50 can easily be changed as the fingers 50 are defined by the slots 59 that are formed in the stamping process.

Moreover, it will be understood that the solder mass 70 does not have to extend across all of the fingers 50 as shown in FIG. 6 but rather a smaller length of solder mass 70 can be interleaved between some but not all of the fingers 50. Thus, one or more ends of the solder mass 70 can be disposed in a slot or against one finger 50 instead of being disposed against a portion of the side or end wall outside of the fingers 50.

While the invention has been particularly shown and described with reference to preferred embodiments thereof, it will be understood by those skilled in the art that various changes in form and details may be made therein without departing from the spirit and scope of the invention.

What is claimed is:

1. An electromagnetic shield comprising:
   a shield body having an upper wall connected to opposing side walls and opposing end walls, wherein at least two opposing walls each have a plurality of resilient fingers formed at a lower edge thereof; and
   a solder mass securely held by the fingers by being interleaved between the fingers of each of the at least two opposing walls.

2. The electromagnetic shield of claim 1, wherein each of the side walls and end walls has a plurality of fingers formed at a lower edge thereof with one solder mass being interleaved between the fingers of one respective wall.

3. The electromagnetic shield of claim 1, wherein each of the upper walls and end walls is connected to the upper wall at a right angle.

4. The electromagnetic shield of claim 1, wherein each finger is defined by slots formed on each side thereof.

5. The electromagnetic shield of claim 1, wherein the solder mass is a solder wire that extends along a lower edge of each of the opposing walls.

6. The electromagnetic shield of claim 1, wherein the interleaved solder mass is held by the fingers such that it does not extend below distal ends of the fingers.

7. The electromagnetic shield of claim 1, wherein the interleaved solder mass is held by the fingers such that it extends below distal ends of the fingers.

8. An electromagnetic shield comprising:
   a shield body having a ground contacting wall that has a plurality of resilient fingers formed at one edge thereof; and
   a solder mass securely held by the fingers by being interleaved between the fingers.

9. A method of mounting an electromagnetic shield to an electronic component having a planar surface, the method comprising the steps of:
   forming a plurality of fingers in the electromagnetic shield, the fingers being formed at one edge of electromagnetic shield, the electromagnetic shield defining an interior space, wherein each finger is defined by a pair of slots formed in the electromagnetic shield;
   interleaving a solder mass between the fingers such that the solder mass is securely held by the fingers;
   disposing the electromagnetic shield on the planar surface of the electronic component so that a first section of the electronic component is disposed within or underneath the interior space of the shield; and
   reflowing the solder mass; and
   cooling the reflowed solder mass so as to provide a secure solder connection between the shield and the electronic component.

10. The method of claim 9, wherein the step of interleaving the solder mass includes the steps of:
    bending a first set of the plurality of fingers in a first direction;
    bending a second set of the plurality of fingers in a second direction which is opposite to the first direction, thereby forming a channel between the first and second set of fingers;
    disposing the solder mass within the channel; and
    bending the first set of fingers in the opposite second direction and bending the second set of fingers in the opposite first direction such that the solder mass becomes interleaved between the first and second of fingers.

11. The method of claim 10, wherein the first and second set of fingers lie substantially within the same plane after being bent after insertion of the solder mass.

12. The method of claim 10, wherein the first set of fingers and the second set of fingers alternative with one another across the lower edge of the electromagnetic shield.

13. The method of claim 10, further including the step of:
    coining the solder mass after it has been interleaved between the first and second set of fingers.

14. The method of claim 10, wherein the first section comprises sensitive circuitry.

15. The method of claim 10, wherein the electronic component comprises a printed circuit board.

* * * * *